United States Patent
Taga et al.

(10) Patent No.: US 6,207,905 B1
(45) Date of Patent: Mar. 27, 2001

(54) GLASS-CERAMIC COMPOSITION, CIRCUIT SUBSTRATE USING THE SAME AND MANUFACTURE METHOD THEREOF

(75) Inventors: Shigeru Taga, Nagoya; Hiroyuki Takahashi, Komaki; Yoshitaka Yoshida, Konan, all of (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/365,028

(22) Filed: Aug. 2, 1999

(51) Int. Cl.$^7$ ................................. H05K 1/03; H05K 3/46
(52) U.S. Cl. ....................... 174/258; 174/255; 174/256; 501/32; 501/65; 361/792; 29/843; 29/830; 29/825; 428/209
(58) Field of Search ....................... 174/258, 260, 174/255, 256, 261, 262, 263, 264, 265, 266; 156/250, 89; 501/128, 32, 65; 29/830, 825, 845

(56) References Cited

U.S. PATENT DOCUMENTS

| | | | |
|---|---|---|---|
| 4,620,264 | * 10/1986 | Ushifusa et al. | 361/792 |
| 4,624,934 | * 11/1986 | Kokubu et al. | 501/17 |
| 4,654,095 | 3/1987 | Steinberg | 156/89 |
| 4,752,531 | 6/1988 | Steinbeg | 428/426 |
| 4,883,705 | * 11/1989 | Kawakami et al. | 428/209 |
| 4,897,509 | * 1/1990 | Holleran et al. | 174/258 |
| 4,939,021 | * 7/1990 | Aoki et al. | 428/209 |
| 4,948,759 | * 8/1990 | Nair | 501/17 |
| 5,164,342 | * 11/1992 | Muralidhar et al. | 501/20 |
| 5,407,871 | * 4/1995 | Mizutani et al. | 501/9 |
| 5,825,632 | * 10/1998 | Tanei et al. | 361/795 |

FOREIGN PATENT DOCUMENTS

| | | |
|---|---|---|
| 54-148012 | 11/1979 | (JP) . |
| 360113984 | * 6/1985 | (JP) . |
| 60-240188 | 11/1985 | (JP) . |
| 361205658 | * 11/1986 | (JP) . |
| 401249656 | * 4/1989 | (JP) . |
| 1-179741 | 7/1989 | (JP) . |
| 4-75185 | 11/1992 | (JP) . |
| 5-129739 | 5/1993 | (JP) . |
| 6-234568 | 8/1994 | (JP) . |
| 6-69902 | 9/1994 | (JP) . |
| 2689270 | 8/1997 | (JP) . |
| 411049531 | * 2/1999 | (JP) . |

* cited by examiner

Primary Examiner—Hyung-Sub Sough
Assistant Examiner—Ishwar B. Patel
(74) Attorney, Agent, or Firm—Sughrue, Mion, Zinn, Macpeak & Seas, PLLC (57) ABSTRACT

In the glass-ceramic composition, a weight ratio of a glass and a ceramic is 40 to 60:60 to 40. The glass is composed of 40 to 60 wt % of $SiO_2$, 5 to 9 wt % of $Al_2O_3$, 1 to 10 wt % of $B_2O_3$, 3 to 5 wt % of $Na_2O+K_2O$, 3 to 15 wt % of $CaO+MgO+ZnO$, and 15 to 40 wt % of PbO, and does not contain $Li_2O$. A softening point of the glass is 650 to 780° C. The circuit substrate includes a laminate substrate formed by laminating insulating substrates, and a conductor circuit formed on a surface of each insulating substrate. The insulating substrate is formed of the glass-ceramic composition. A wiring layer and a via hole conductor are provided inside the laminate substrate.

9 Claims, 6 Drawing Sheets

GLASS-CERAMIC COMPOSITION, CIRCUIT SUBSTRATE USING THE SAME AND MANUFACTURE METHOD THEREOF

BACKGROUND OF THE INVENTION (i) Field of the Invention

The present invention relates to a glass-ceramic composition for use, for example, in a circuit substrate or a chip component, a circuit substrate using the composition and a method of manufacturing the circuit substrate.

(ii) Description of the Related Art

Recently, in response to request for higher performance of ceramic substrates and miniaturization of chip components, a glass ceramic substrate has been turned to practical use Detail compositions, manufacture methods, and the like are described in Japanese Patent Publication Nos. 97565/1994 and 69902/1994.

For example, Japanese Patent Publication No. 97565/1994 discloses a glass ceramic composition in Example 1, in which a weight ratio of glass and $Al_2O_3$ is 66:34 (33.5 wt %: 17.1 wt %). The glass is composed of 17.2 wt % of PbO, 4.5 wt % of $B_2O_3$, 56.5 wt % of $SiO_2$, 9.1 wt % of $Al_2O_3$, 8.6 wt % of CaO, 2.4 wt % of $Na_2O$, and 1.7 wt % of $K_2O$. A glass deformation temperature is 590° C., a softening point is 660° C., and a difference of the softening point and deformation temperature is 70° C. It is further described that a glass ceramic tape obtained by sintering the glass-ceramic composition is superior in dimensional stability.

Moreover, Japanese Patent Publication No. 69902/1994 discloses a glass ceramic composition in Example 1, which is composed of 60 wt % of glass and 40 wt % of $Al_2O_3$ The glass is composed of 50 wt % of $SiO_2$, 6 wt % of $Al_2O_3$, 35 wt % of PbO, 5 wt % of (MgO+CaO+SrO+BaO), 1 wt % of ZnO, 0.5 wt % of $B_2O_3$, 0 wt % of ($Li_2O+Na_2O+K_2O$), and 2.5 wt % of ($TiO_2+ZrO_2$). It is described that when the composition is formed into a slurry and a resulting green sheet is fired, an obtained substrate has large resistance strength and large thermal conductivity, and is superior in thermal resistance and chemical resistance. It is further described that when Ag—Pd conductors are formed on the green sheet by screen printing, laminated and fired to form a glass-ceramic laminate, a multilayered circuit element is superior in solder wettability and bonding strength.

These glass-ceramic compositions or the glass-ceramic composites have been heretofore used as circuit substrates by forming conductor paths inside or on the surface of the each layer or the laminate. However, matching properties with various conductor materials have not been studied sufficiently.

The present inventors have studied this respect, and found out the following problems. Specifically, in the case where a glass composition having a high softening point is employed, when an Ag or Au system conductor circuit is screen-printed on the green sheet and then fired, conductor materials are dispersed in a ceramic, thereby deteriorating an insulating resistance, dielectric constant and other electric properties of the ceramic. A performance could not be obtained as designed. Moreover, in the case where a glass composition having a low softening point is employed, since the Ag or Au system conductor material is not sufficiently sintered, a bonding strength of the glass-ceramic composite and conductor circuit probably becomes insufficient. One of problems is the warp, or deformation of the substrate when the substrate is fired together with the conductive materials. For example, in a substrate in which a large number of pieces each of about 1×10 mm are arranged on a large plate with a size of about 100×100 mm, the generation of the warp, or deformation causes a fatal defect in a solder printing process after the substrate is fired, or in a process for mounting electronic components or parts.

SUMMARY OF THE INVENTION

Wherefore, an object of the present invention is to provide a glass-ceramic composition excellent in various properties of a ceramic and also excellent in matching properties with an Ag or Au system conductor material, a circuit substrate using the composition and a method of manufacturing the circuit substrate.

To attain this and other objects, according to a first aspect of the present invention, there is provided a glass-ceramic composition in which a weight ratio of a glass and a ceramic is 40 to 60:60 to 40. The glass is composed of 40 to 60 wt % of $SiO_2$, 5 to 9 wt % of $Al_2O$, 1 to 10 wt % of $B_2O$, 3 to 5 wt % of $Na_2O+K_2O$, 3 to 15 wt % of CaO+MgO+ZnO, and 15 to 40 wt % of PbO, and does not contain $Li_2O$. A softening point of the glass is in the range of 650 to 780°.

As physical properties of the glass in the glass-ceramic composition, it is preferred that a difference of the softening point and a yield point be 95° C. or higher and that a glass transition point be in the range of 520 to 620° C. The glass-ceramic composition is preferably fired at a firing temperature of 800 to 930° C. under an oxidizing atmosphere. As the ceramic, alumina, silica, mullite, magnesia, titania, zirconia, spinel, forsterite, strontium titanate, calcium titanate and the like are preferably used alone or appropriately mixed for use.

According to a second aspect of the present invention, there is provided a circuit substrate which includes a layered substrate formed by laminating a plurality of insulating substrates, and a conductor circuit formed at least on a surface of each of the plurality of insulating substrates.

The insulating substrate is formed of the glass-ceramic composition according to the first aspect of the present invention.

The conductor circuit is preferably formed of an Ag or Au system conductor, and has an inductance circuit or a capacitance circuit.

According to a third aspect of the present invention, there is provided a method of manufacturing a circuit substrate which is provided with a step of preparing a green sheet composed of the glass-ceramic composition of the first aspect, a step of forming an Ag or Au system conductor layer at least on a surface of the green sheet, a step of laminating a plurality of green sheets each having the conductor layer formed thereon, and a step of firing the laminated green sheets at a firing temperature in the range of 800 to 930° C. under an oxidizing atmosphere.

In a conventional circuit substrate using a Cu conductor as a low resistance concuctor, a heat-resistant epoxy resin is used as a substrate material. Since the heat-resistant epoxy resin has a large dielectric loss in a microwave band, a signal transmission loss is also large. This causes a problem that such resin is not suitable for an application to the substrate used in the microwave band. Therefore, for the microwave band, both the conductor loss and the dielectric loss need to be small. In this respect, the circuit substrate of the present invention using the Ag or Au system conductor material is superior.

In the glass-ceramic composition of the present invention, the glass and ceramic weight ratio is 40 to 60:60 to 40 for the following reasons:

Specifically, when a glass content is less than 40 relative to the entire glass and ceramic weight of 100, the amount of glass components for covering peripheries of ceramic particles becomes insufficient during the firing of the glass-ceramic composition to form the insulating substrate. An excellent wetting cannot be obtained, an apparent porosity of the substrate fails to become zero, and a substrate strength is lowered. On the other hand, when the glass content exceeds 60, a sufficient bending strength cannot be obtained. Additionally, the glass-ceramic composition may be constituted only of the glass and the ceramic, or may contain other components. Moreover, in a preferable range, the glass and ceramic weight ratio is 45 to 55:55 to 45.

A glass component $SiO_2$ is a glass network former and a glass basic composition. The content of $SiO_2$ is in the range of 40 to 60 wt %, because when the content is less than 40 wt %, the softening point tends to be lower than 650° C. When the content exceeds 60 wt %, the softening point tends to become hi-her than 780° C., and a sufficient strength cannot be obtained.

Another glass component $Al_2O_3$ enhances a glass solubility, or a water resistance as one of glass properties. When the content of $Al_2O_3$ is less than 2 wt %, devitrification might occur during glass melting. When it exceeds 10 wt %, the softening point becomes excessively high. A preferable content of $Al_2O_3$ is in the range of 5 to 9 wt %.

Another glass component $B_2O_3$ lowers the softening point as a glass flux component. The content of $B_2O_3$ is in the range of 1 to 10 wt %, because when the content is less than 1 wt %, the softening point tends to become high. When it exceeds 10 wt %, the glass flows excessively when fired together with the Ag or Au system conductor material. Then, there is a probability that Ag or Au system is dispersed in the insulating substrate.

Further glass component $(Na_2O+K_2O)$ lowers the glass softening point. The content of $(Na_2O+K_2O)$ is in the range of 3 to 5 wt %, because when the content is less than 3 wt %, the softening point tends to become high. When it exceeds 5 wt %, the insulation resistance of the insulating substrate is lowered. Moreover, another alkali metal oxide $Li_2O$ provides the similar action, but $Li^+$ has a small ion radius so that it can easily move in the glass. When $Li_2O$ is sintered together with the Ag or Au system conductor material, Ag or Au is easily dispersed in the circuit substrate. Therefore, according to the present invention, $Li_2O$ is not contained in the glass components.

Another glass component $(CaO+MgO+ZnO)$ fills a role of regulating a glass thermal expansion coefficient and lowering the softening point. The content of $(CaO+MgO+ZnO)$ is in the range of 3 to 15 wt %, because when the content is less than 3 wt %, the role is not sufficiently performed. When it exceeds 15 wt %, devitrification occurs, or vitrification becomes difficult.

Further glass component PbO lowers the glass softening point as the glass flux component. The content of PbO is in the range of 15 to 40 wt %, because when the range is deviated, conversely the softening point tends to become higher.

Here, all of the glass components $B_2O_3$, $(Na_2O+K_2O)$ and PbO fill the role of lowering the softening point. Therefore, each of these components may be used alone to lower the softening point. However, when the softening point is intended to be sufficiently lowered using $B_2O_3$ or $(Na_2O+K_2O)$ alone, the amount is so large that other disadvantages are inappropriately generated. In the former case, Ag or Au is dispersed into the ceramic. In the latter case, the insulating resistance is lowered. Moreover, when the softening point is intended to be sufficiently lowered using PbO alone, the excessive amount of PbO conversely raises the softening point, which is inappropriate. Therefore, the components $B_2O_3$, $(Na_2O+K_2O)$ and PbO need to be appropriately set in the aforementioned ranges so as to obtain the softening point in the range of 650 to 780° C.

In the glass-ceramic composition of the present invention, the softening point is fixed in the numerical-value range of 650 to 780° C., because when the physical property lowers below the lower limitation, during the firing together with the Ag or Au system conductor material, the ceramic is sintered, but the conductive material might be insufficiently sintered. When the physical property is above the upper limitation, the firing temperature becomes excessively high so that Ag or Au is probably dispersed in the insulating substrate.

Moreover, a difference of the softening point and yield point (also referred to as the deformation temperature) is preferably 95° C. or higher. This is because when the difference is less than 95° C., during the firing together with the Ag or Au system conductor material, warp is increased. The difference is more preferably in the range of 95 to 120° C. Additionally, for the same reason, the yield point is preferably in the range of 555 to 685° C., while the glass transition point is in the range of 520 to 620° C.

Since the glass-ceramic composition of the present invention contains PbO in the glass components, the firing is preferably performed under an oxidation atmosphere, e.g., in the atmosphere. When the firing is performed under a reduction atmosphere, PbO is reduced, and the insulation resistance is probably lowered. Moreover, when the firing is performed under the oxidation atmosphere in this manner, the Ag or Au system which is not easily oxidized is preferably used as the conductor material. For example, as the Ag system conductor material, Ag—Pd, Ag—Pt or the like can be used. Furthermore, organic substances in the green sheet to be fired are evaporated or burnt out. Additionally, in consideration of the matching property with the conductive material, such as sintering properties of the glass ceramic and the conductor material during the firing of both, the prevention of Ag or Au from being dispersed, and the like, the firing temperature is preferably in the range of 800 to 930° C.

BRIEF DESCRIPTION OF THE DRAWINGS

FIGS. 2A and 2B are perspective views of layered substrates of the low-pass filter incorporated coupler shown in FIG. 1:

DETAILED DESCRIPTION OF THE PREFERRED EMBODIMENTS

Embodiments of the present invention will be described hereinafter with reference to the drawings.

Fine metal oxides were mixed in the proportions listed as "GLASS COMPOSITION" in Table 1. Each mixture was molten, then solidified, and ground to obtain glass powder having an average particle diameter in the range of 3 to 5 $\mu$m. Subsequently, the glass powder and ax-alumina having an average particle diameter of 3 $\mu$m were mixed at the ratio shown in Table 1. The glass ceramic compositions of Examples 1 to 5, Comparative Examples 1 to 4 were obtained in this manner. Subsequently, to 100 parts by weight of each glass-ceramic composition, 10 parts by weight of a binder component or acrylic resin, 5 parts by weight of a plasticizer or dibutyl phthalate, further an appropriate amount of an organic solvent or methyl ethyl ketone were mixed to form a slurry. Thereafter, a 0.3 mm thick green sheet was prepared by a doctor blade process.

Additionally, measurements of the glass transition point, softening point and yield point were performed using a measuring apparatus or model TG-DTA TAS300 manufactured by Kabushlki Kaisha Rigaku, by inserting 30 to 50 mg of sample powder to a platinum ampul, and by raising a temperature from a room temperature to 1200° C. at 10° C./min.

(2) Bending Strength:
A three-point bending test was conducted in accordance with JIS-R1601 (method of testing a binding strength of a fine ceramic).

(3) Young's Modulus:
An ultrasonic pulse method of JIS-R1602 was performed.

(4) Dielectric Constant, Dielectric Loss:
After the substrate was abraded/processed into a thickness of 0.63 mm, these properties were measured in a dielectric resonator perturbation method.

(5) Withstand Voltage:
A test was performed in accordance with JIS-C2110.

(6) Thermal Expansion Coefficient:
A test was performed in accordance with JIS-R1618.

(7) Thermal Conductivity:
A test was performed in accordance with JIS-R1611.

Simultaneous Sintering Property Test

An Ag metallized paste was prepared as follows:
Specifically, to 100 parts by weight of Ag powder with an average particle diameter of 3 $\mu$m, 2 parts by weight of glass powder with the same composition as the glass in the glass-ceramic composition were applied. Furthermore, an organic binder or ethyl cellulose and a solvent or butyl carbitol were applied. The components were mixed using three rollers to prepare the paste.

The resulting paste was screen-printed in a manner of 30 mm length, 30 mm width and 20 $\mu$m thickness on the green

TABLE 1

| | EXAMPLE | | | | | COMPARATIVE EXAMPLE | | | |
|---|---|---|---|---|---|---|---|---|---|
| | 1 | 2 | 3 | 4 | 5 | 1 | 2 | 3 | 4 |
| ALUMINA | 50 | 45 | 55 | 50 | 50 | 50 | 50 | 30 | 70 |
| GLASS (GLASS COMPOSITION) | 50 | 55 | 45 | 50 | 50 | 50 | 50 | 70 | 30 |
| $SiO_2$ | 49 | ← | ← | 56 | 47 | 47 | 53 | 49 | ← |
| $Al_2O_3$ | 5 | ← | ← | 9 | 6 | 4 | 5 | 5 | ← |
| $B_2O_3$ | 5 | ← | ← | 5 | 8 | 8 | 7 | 5 | ← |
| $Li_2O$ | — | — | — | — | — | 2 | 3 | — | — |
| $Na_2O$ | 2.5 | ← | ← | 2.5 | 2 | 4 | — | 2.5 | ← |
| $K_2O$ | 1.5 | ← | ← | 1.5 | 2 | — | — | 1.5 | ← |
| CaO | 5 | ← | ← | 8 | 4 | 7 | 9 | 5 | ← |
| MgO | — | — | — | 1 | 1 | 1 | — | — | — |
| ZnO | — | — | — | — | 3 | — | — | — | — |
| PbO | 32 | ← | ← | 17 | 27 | 27 | 23 | 32 | ←' |
| GLASS TRANSITION POINT Tg (° C.) | 540 | ← | ← | 609 | 545 | 493 | 530 | 540 | ← |
| YIELD POINT Td (° C.) | 577 | ← | ← | 651 | 575 | 523 | 559 | 577 | ← |
| SOFTENING POINT Ts (° C.) | 678 | ← | ← | 762 | 685 | 609 | 651 | 678 | ← |
| (TsTd) | 101 | ← | ← | 111 | 110 | 86 | 92 | 101 | ← |
| THERMAL EXPANSION COEFFICIENT ($\times 10^{-6}$/° C.) | 64 | ← | ← | 60 | 58 | 77 | 66 | 64 | ← |

Test on Various Properties of Ceramic

The obtained green sheet was fired at a firing temperature described in Table 2 to form an insulating substrate, and the substrate was evaluated for the following items.
Results are shown in Table 2.

(1) Apparent Porosity:
A test was conducted in accordance with JIS (Japanese Industrial Standard)-02141 (method of testing an electric insulating ceramic material).

sheet with 50 mm length, 50 mm width and 0.3 mm thickness. The green sheet was fired at a ceramic firing temperature described in Table 2, so that the Ag powder and ceramic were simultaneously sintered. After the sintering, the warp of the circuit substrate was measured. Moreover, the coloring of the substrate was visually evaluated. Results are shown in Table 2. Additionally, when Ag dispersion was generated, a boundary portion of the substrate and conductor turned to yellow.

TABLE 2

| | EXAMPLE | | | | | COMPARATIVE EXAMPLE | | | |
|---|---|---|---|---|---|---|---|---|---|
| | 1 | 2 | 3 | 4 | 5 | 1 | 2 | 3 | 4 |
| CERAMIC PROPERTIES | | | | | | | | | |
| FIRING TEMPERATURE (° C.) | 850 | 800 | 900 | 900 | 850 | 750 | 850 | 780 | 950 |
| APPARENT POROSITY (%) | 0 | 0 | 0 | 0 | 0 | 0 | 0 | 0 | 8 |
| BENDING STRENGTH (MPa) | 235 | 230 | 240 | | | | | 150 | |
| YOUNG'S MODULUS (GPa) | 125 | 120 | 130 | | | | | | |
| DIELECTRIC CONSTANT: | | | | | | | | | |
| 3GHz(×10$^{-3}$) | 7.9 | 8.1 | 8.2 | | | | | | |
| 12GHz(×10$^{-3}$) | 7.7 | 7.9 | 8 | | | | | | |
| DIELECTRIC LOSS: | | | | | | | | | |
| 3GHz(×10$^{-3}$) | 4.8 | 4.5 | 4 | | | | | | |
| 12GHz(×10$^{-3}$) | 7.7 | 7.3 | 6.8 | | | | | | |
| WITHSTAND VOLTAGE(KV/mm) | >15 | >15 | >15 | | | | | | |
| THERMAL EXPANSION COEFFICIENT/RT TO 400° C. (×10$^{-6}$/° C.) | 6.1 | 6.3 | 6.4 | | | | | | |
| THERMAL CONDUCTIVITY(WK/° C.) | 3 | 2.9 | 3.4 | | | | | | |
| SIMULTANEOUS SINTERING PROPERTIES WARPAGE (μm) | <5 | <5 | <5 | <5 | <5 | 10 | 10 | | |
| Ag DISPERSION (COLOR CHANGE) | NO | NO | NO | NO | NO | YES | YES | | |
| EVALUATION* | G | G | G | G | G | NG | NG | NG | NG |

EVALUATION* G: good NG: no good

Evaluation Results

As apparent from Table 2, the insulating substrate and circuit substrate obtained from the glass-ceramic composition of Example 1 were both excellent in ceramic properties. When the substrate was fired together with the Ag system conductor material, extremely small warp was found, and no Ag dispersion was observed. Satisfactory properties as the green sheet or the circuit substrate were obtained.

The insulating substrate and circuit substrate obtained from the glass-ceramic composition of Example 2 or 3 are the same as those of Example 1, except in that the glass and alumina weight ratios are different. In the same manner as Example 1, the ceramic properties are excellent. When the substrate was fired together with the Ag system conductor material, extremely small warp was found, and no Ag dispersion was observed. Satisfactory properties as the green sheet or the circuit substrate were obtained.

The insulating substrate and circuit substrate obtained from the glass-ceramic composition of Example 4 or 5 are the same as those of Example 1, except in that the glass compositions are different. In the same manner as Example 1, when the substrate was fired together with the Ag system conductor material, extremely small warp was found, and no Ag dispersion was observed. Additionally, since Example 4 has a smaller total amount of main components for lowering the softening point, i.e., $B_2O_3$ and $KnO+Na_2O$ and PbO as compared with the other embodiments, the softening point was raised.

The insulating substrate and circuit substrate obtained from the glass-ceramic composition of Comparative Example 1 are substantially the same as those of Example 1, except in that the glass composition is different ($Li_2O$ is contained), the glass transition point Tg, yield point Td and softening point Ts are all low and that (Ts—Td) is small as 86° C. However, when the substrate was fired together with the Ag system conductor material, the color change by the Ag dispersion was found. Satisfactory properties as the green sheet and circuit substrate were not obtained.

The insulating substrate and circuit substrate obtained from the glass-ceramic composition of Comparative Example 2 are substantially the same as those of Example 1, except in that the glass composition is different ($Li_2O$ is contained) and that (Ts-Td) is small as 92° C. However, when the substrate was fired together with the Ag system conductor material, the warp was large, and the color change by the Ag dispersion was found. Satisfactory properties as the green sheet and circuit substrate were not obtained.

The insulating substrate and circuit substrate obtained from the glass-ceramic composition of Comparative Example 3 or 4 are substantially the same as those of Example 1, except in that the glass and alumina weight ratio is different. In Comparative Example 3 in which too much glass is contained, the bending strength of the ceramic is low. In Comparative Example 4 in which too little glass is contained, the apparent porosity fails to become zero and the sintering is insufficient. These examples are not suitable for the practical use.

Additionally, for the insulating substrate obtained from the glass-ceramic composition of Example 1 of the present invention, when powder X-ray diffraction was performed, the presence of anorthite was confirmed.

By applying the insulating substrate obtained from the glass-ceramic composition of the present embodiment, a microwave circuit chip can be prepared.

A low-pass filter incorporated coupler as an example of the microwave circuit chip to which the present embodiment is applied, and an inductance circuit and a capacitance circuit constituting the coupler will next be described.

Figure 1:
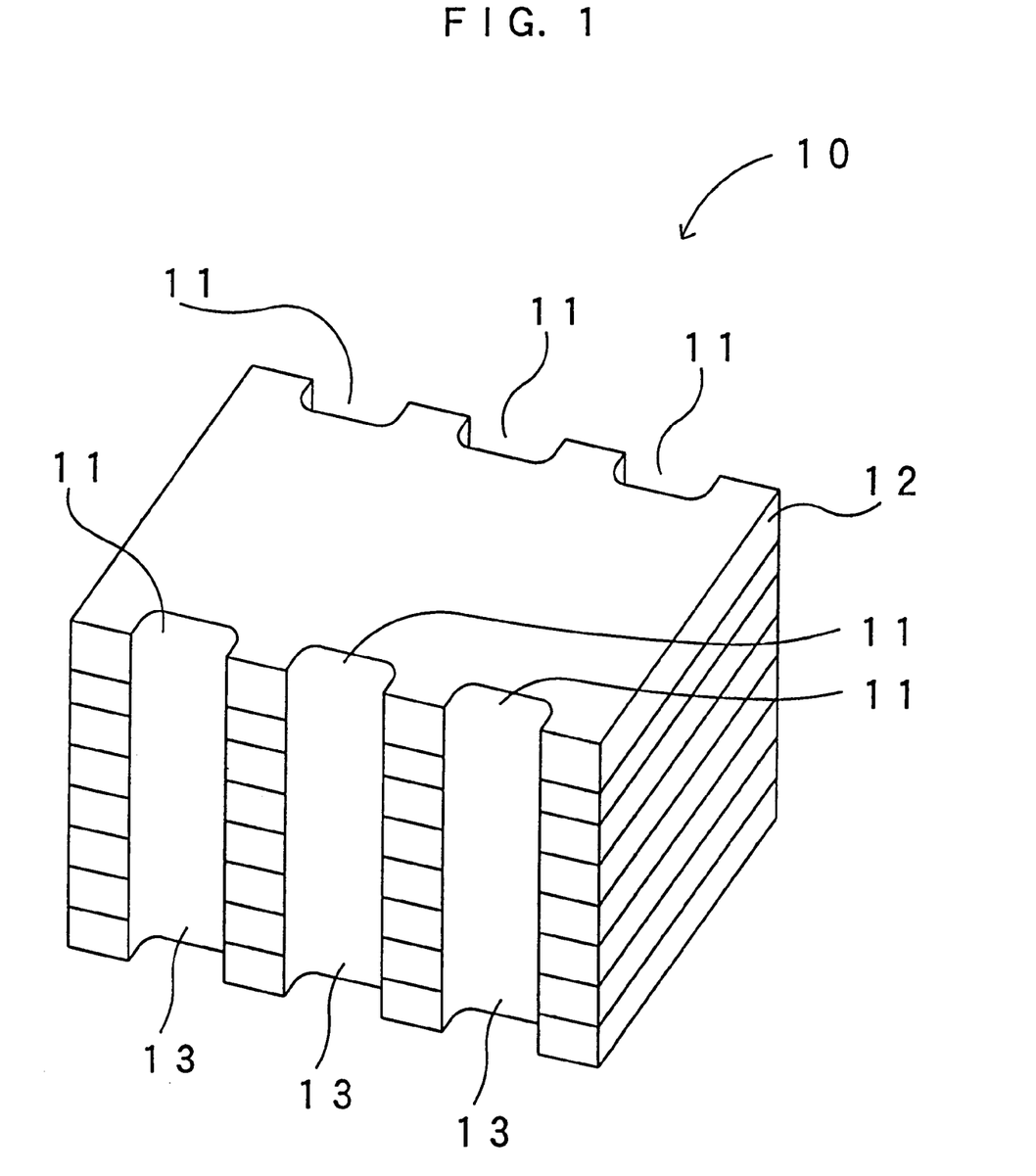
FIG. 1 is a schematic view of a low-pass filter incorporated coupler for use in a cellular phone according to one embodiment of the present invention.

FIG. 1 is a schematic view of the low-pass filter incorporated coupler for use in a cellular phone. As shown in FIG. 1, a low-pass filter incorporated coupler 10 is constituted by laminating eight layers of insulating substrate 12. In each insulating substrate 12, necessary circuit elements are formed on a surface of the insulating substrate of Example 1. The low-pass filter incorporated coupler 10 has a length of 3.2 mm, width of 1.6 mm and height of 1.3 mm. FIG. 1 is a schematic view, and it is to be noted that a longitudinal contraction scale is not identical to a transverse contraction scale. In six recesses 11 formed in opposite side surfaces of the low-pass filter incorporated coupler 10, wires 13 are provided as interlayer conductors for electrically connecting the circuit elements of one layer to those of the other layer.

Figure 2A:
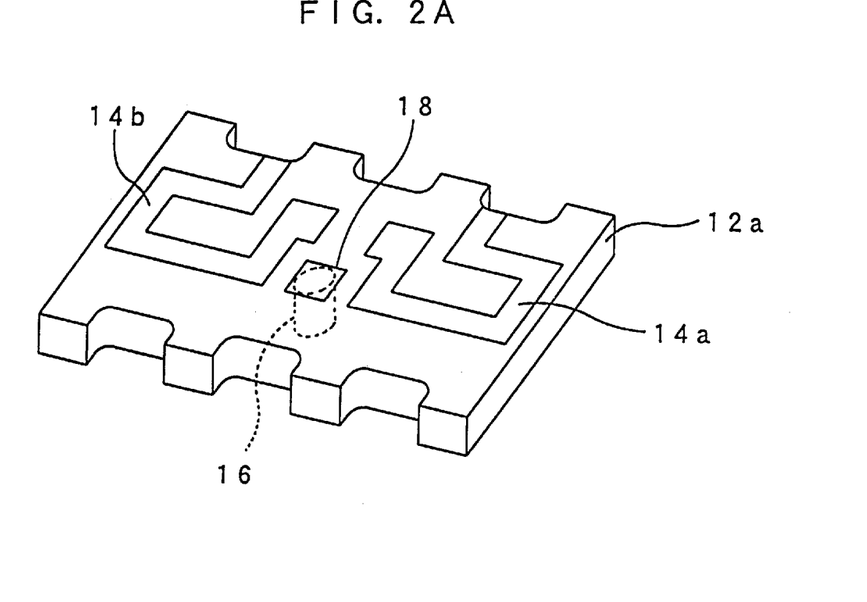
FIG. 2A shows a substrate with inductance circuits provided thereon.
Figure 2B:
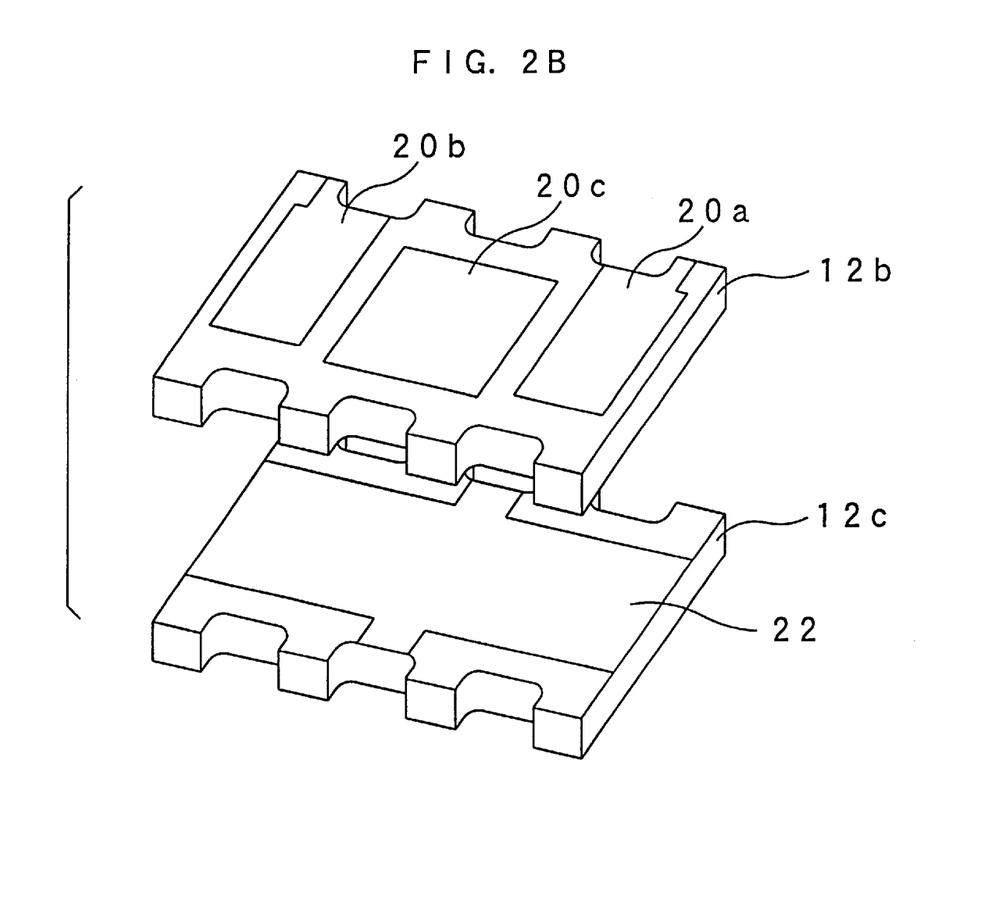
FIG. 2B shows substrates with capacitance circuits provided thereon.

FIGS. 2A and 2B show substrates with inductance circuits and capacitance circuits provided thereon, respectively, among the laminate substrates of the low-pass filter incorporated coupler shown in FIG. 1.

In an insulating substrate 12a shown in FIG. 2A, inductance circuits 14a and 14b, a via hole conductor 16 as an interlayer conductor, and a contact area 18 electrically connected to the via hole conductor 16 are formed. As shown in FIG. 2B, capacitance circuits 20a, 20b and 20c are formed on an insulating substrate 12b, while a capacitance circuit 22 is formed on an insulating substrate 12c.

The inductance circuits 14a and 14b and the contact area 18 shown in FIG. 2A are electrically connected to circuit elements of another insulating substrate laminated on the insulating substrate 12a, and the via hole conductor 16 is electrically connected to circuit elements of another insulating substrate laminated under the insulating substrate 12a. Capacitance is formed by electrostatic capacity formed between the capacitance circuits 20a, 20b, 20c and the capacitance circuit 22.

Figure 3:
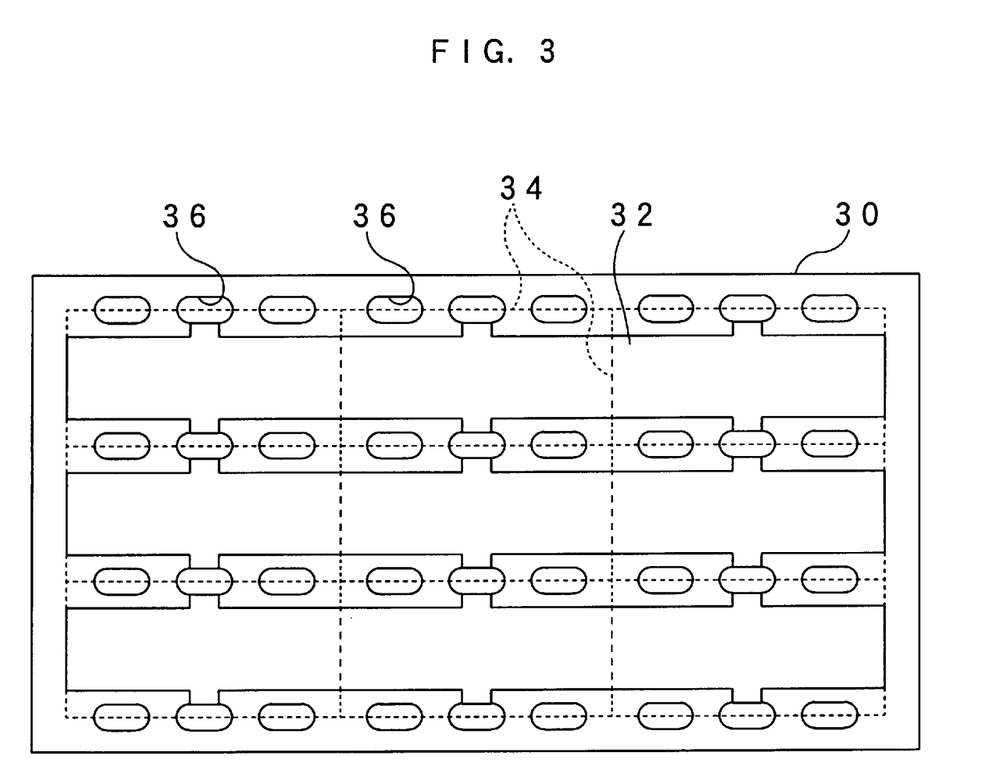
FIG. 3 is a plan view of a ceramic green sheet from which nine pieces of the insulating substrate shown in FIG. 2B are taken.

A method of manufacturing the low-pass filter incorporated coupler 10 will next be described with reference to FIG. 3. FIG. 3 is a plan view of a ceramic green sheet from which nine pieces of the insulating substrate 12c shown in FIG. 2B are taken. A circuit pattern 32 of a silver paste for forming the capacitance circuit is screen-printed on a top surface of a green sheet 30. In FIG. 3, dotted lines 34 show cut lines for separating each insulating substrate. Through holes 36 for forming the recesses 11 shown in FIG. 1 are punched along the dotted lines 34.

A necessary circuit pattern as shown in FIG. 2A or 2B is formed on the insulating substrate 12. Eight layers of the substrates are laminated. Subsequently, a silver platinum paste is screen-printed on an inner wall surface of each through hole 36. Subsequently, cutting is performed along the dotted lines 34 shown in FIG. 3. Then, the green sheet constituting the insulating substrate and the silver platinum paste constituting the circuit pattern are simultaneously fired. The low-pass filter incorporated coupler shown in FIG. 1 is obtained in this manner.

Figure 4:
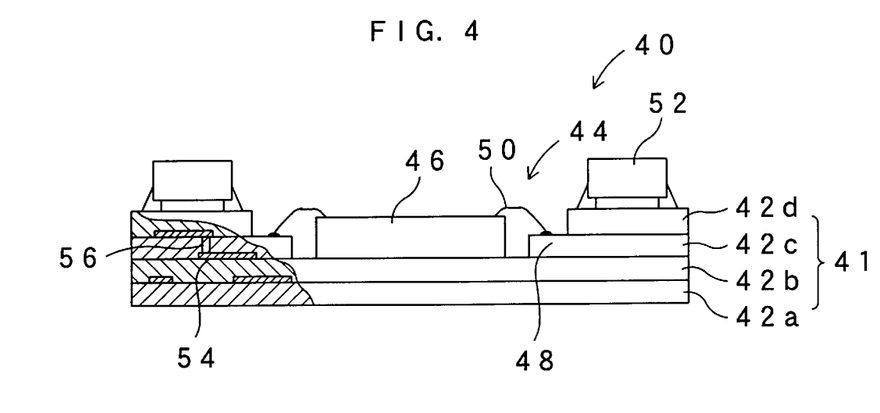
FIG. 4 is a partially cut-away sectional view showing a power amplifier to which the present invention is applied.

FIG. 4 is a partially cut-away sectional view showing the power amplifier to which the present embodiment is applied. As shown in FIG. 4, a power amplifier 40 is constituted by laminating four insulating substrates 42a to 42d, and a cavity 44 is provided in a central portion of a laminate substrate 41. Insulating substrates 42c, 42d in the area of the cavity 44 form a double-layer structure. A semiconductor chip 46 with an integrated circuit formed thereon is mounted on the insulating substrate 42b which defines the cavity 44. A step portion 48 and the semiconductor chip 46 which surround the cavity 44 are electrically interconnected via a bonding wire 50. A resistance or another chip component 52 is attached to an uppermost layer or fourth insulating substrate 42d. A wiring layer 54 and a via hole conductor 56 are provided inside the laminate substrate 41.

A method of manufacturing the power amplifier will next be described, and first a method of manufacturing a laminate substrate for use in the power amplifier will be described.

In the same manner as Example 1, a 0.15 mm thick green sheet is formed, and a piece cut in a size of 100 mm×100 mm is prepared. A necessary circuit pattern is printed in a matrix manner on each-layer green sheet using a paste of Ag and/or Pt by the screen printing process. Moreover, a hole for forming the step portion 48 and the cavity 44 is formed in a matrix manner in green sheets of third and fourth layers from the bottom. Subsequently, the green sheets with the circuit patterns printed thereon are laminated, and the green sheet and the paste of Ag and/or Pt for forming the circuit are simultaneously fired. Fired large-scaled laminate substrates are shown in FIGS. 6 to 8.

Figure 6:
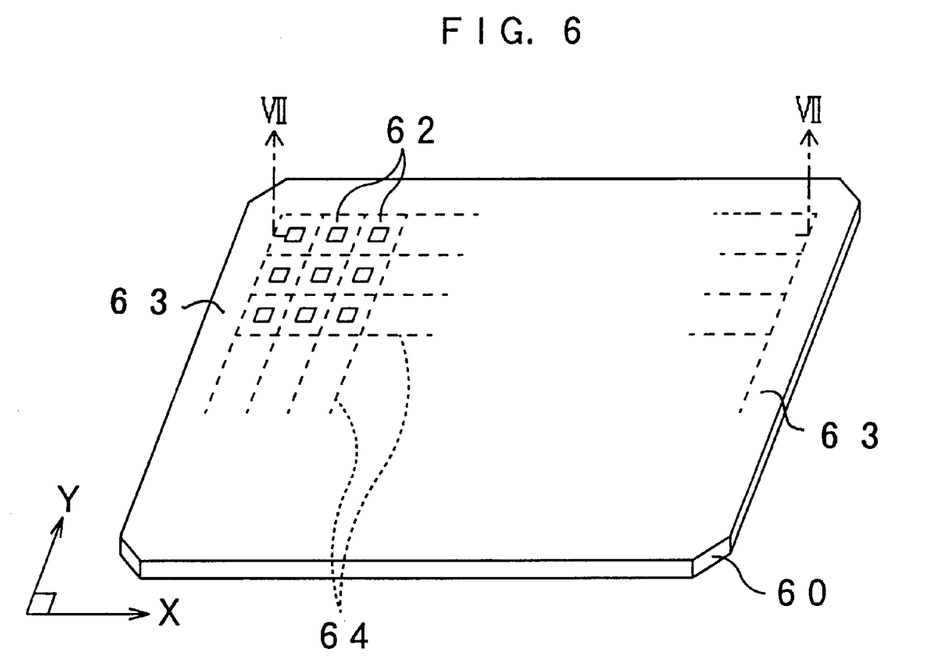
FIG. 6 is a perspective view showing a large-scaled laminate substrate to which the present invention is applied.

As shown in FIG. 6, a large-scaled laminate substrate 60 is provided with a large number of chip areas 62 which are extended in X and Y directions orthogonal to each other. A large number of substrates for power amplifiers can be prepared from one laminate substrate 60 by cutting the chip areas 62 along cutting lines 64 shown by dotted lines.

Figure 7:
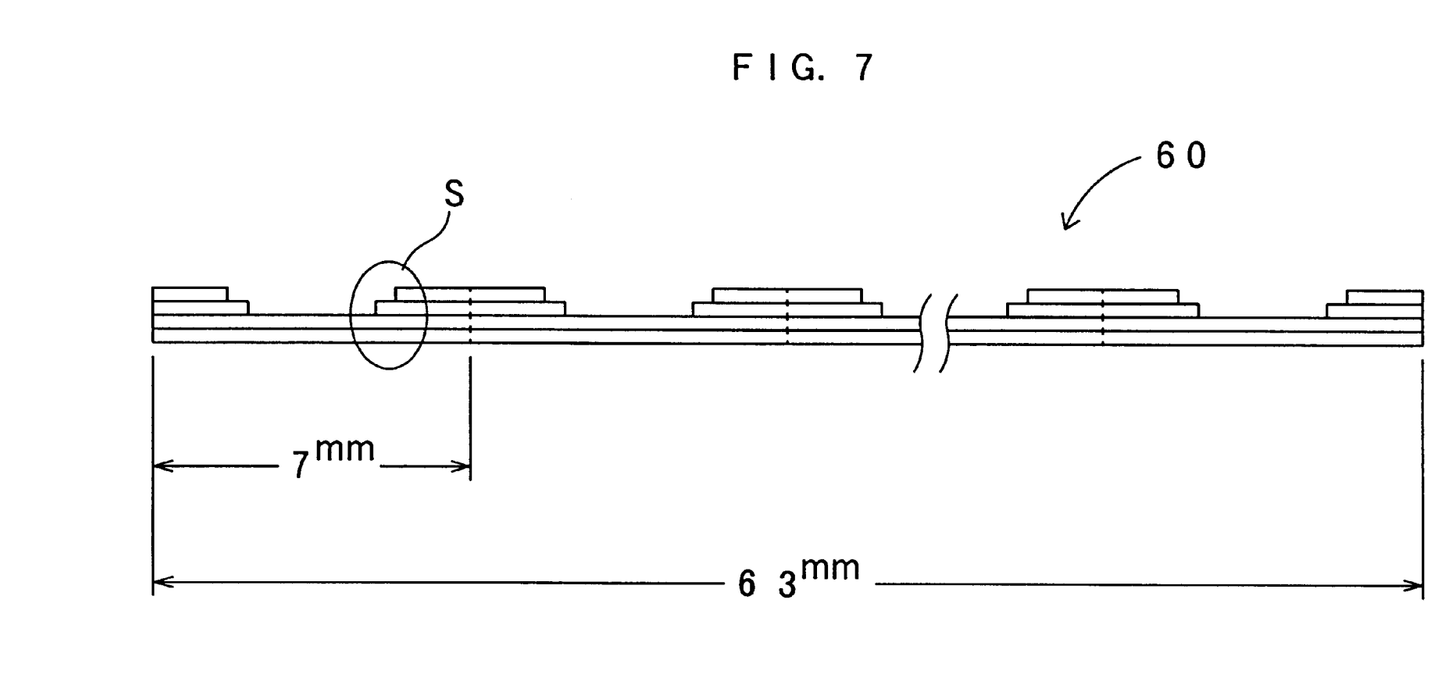
FIG. 7 is a sectional view taken along line VII—VII shown in FIG. 6.

FIG. 7 is a sectional view taken along line VII—VII shown in FIG. 6. As shown in FIG. 7, the laminate substrate excluding both edge portions 63 from the entire laminate substrate 60 has a length of 63 mm, while one chip area 62 has a length of 7 mm. The entire laminate substrate 60 has a length of 75 mm.

Figure 8:
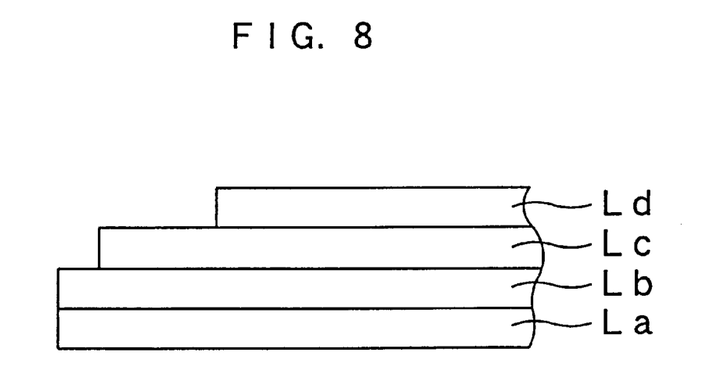
FIG. 8 is an enlarged view of region S shown in FIG. 7.

FIG. 8 is an enlarged view of a portion S shown in FIG. 7. As shown in FIG. 8, the laminate substrate 60 is formed of layers La, Lb, Lc and Ld. Each layer is provided with a metallized layer to form a metal wiring, pad or the like. An Ag—Pt metallized layer is provided on the undersurface of the layer La, and an Ag metallized layer is provided on the upper surface thereof. Ag—Pt metallized layers are provided on upper surfaces of the layers Lb, Lc and Ld. Moreover, on the undersurface of the layer La and exposed portions of the layers Lb, Lc and Ld, a ceramic coat is formed to cover and insulate the metallized layers. As described above, the laminate substrate 60 is formed by laminating and firing a plurality of insulating substrates with the Ag and/or Pt metallized layers provided thereon. When the composition of the insulating substrate is set in the range of the present invention as described above, the insulating substrate physically matches the conductive layer. Therefore, even when the large-scaled laminate substrate 60 is prepared as described above, there is substantially no warp or deformation on the laminate substrate after the firing.

Subsequently, the integrated circuits and chip components are mounted, and an electromagnetic shielding metal cap (not shown) is attached. Then, cutting is performed along the dotted lines 64 shown in FIG. 6. Thereby, a large number of power amplifier components are obtained from one substrate.

Figure 5:
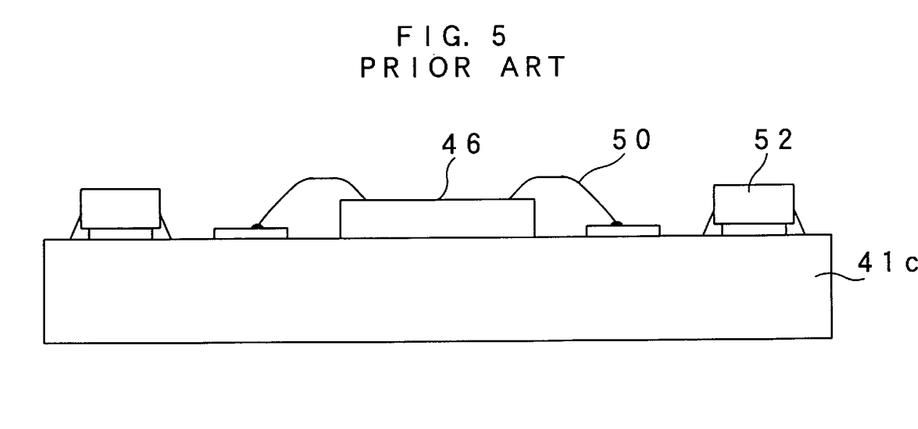
FIG. 5 is a side view of a conventional power amplifier.

The power amplifier shown in FIG. 4 is made smaller as compared with the conventional power amplifier shown in FIG. 5. Since the conventional power amplifier substrate is formed of one-layer substrate 410, wires and circuit elements can be provided only on a substrate surface, thereby requiring a large area. In the laminate substrate to which the present invention is applied, since the wires and circuit elements, if necessary, can be provided inside the substrate, a power amplifier compacter than the conventional power amplifier can be obtained.

As described above, the laminate substrate provided with the metallized layers therein according to the present invention is characterized in that it is large-scaled but has neither warp nor deformation. For example, the warp after the firing in the large-scaled laminate substrate 60 of the four 75 mm×75 mm layers is 40 µm or less. Therefore, the power amplifier can be prepared at a high production efficiency using such large-scaled laminate substrate. Moreover, the power amplifier can be miniaturized.

Additionally, in the above embodiment, as the circuit constitution to which the present invention is applied, the low-pass filter incorporated coupler and the power amplifier have been described, but the present invention can be applied to a circuit of a low-pass filter, high-pass filter or another filter, or another microwave circuit.

The embodiment of the present invention is not limited to the aforementioned embodiment and, needless to say, can be modified in various modes without departing from the technical scope of the present invention.

What is claimed is:

1. A glass-ceramic composition, wherein a weight ratio of a glass and a ceramic is 40 to 60:60 to 40, said glass is composed of:

40 to 60 wt % of $SiO_2$;

5 to 9 wt % of $Al_2O_3$;

1 to 10 wt % of $B_2O_3$;

3 to 5 wt % of $Na_2O+K_2O$;

3 to 15 wt % of $CaO+MgO+ZnO$; and 15 to 40 wt % of PbO, and does not contain $Li_2O$, and a softening point of said glass is in the range of 650 to 780° C.

2. The glass-ceramic composition according to claim 1, wherein a difference of the softening point and a yield point of said glass is 95° C. or higher.

3. The glass-ceramic composition according to claim 1, wherein a transition point of said glass is in the range of 520 to 620° C.

4. The glass-ceramic composition according to claim 1, wherein said ceramic is alumina, silica, mullite, magnesia, titania, zirconia, spinel, forsterite, strontium titanate, or calcium titanate, or a mixture thereof.

5. A circuit substrate, comprising:

a laminate substrate formed by laminating a plurality of insulating substrates; and a conductor circuit formed at least on a surface of each of said plurality of the insulating substrates, said insulating substrate being formed of the glass-ceramic composition according to claim 1.

6. The circuit substrate according to claim 5, wherein said conductor circuit comprises an Ag or Au system conductor.

7. The circuit substrate according to claim 6, wherein the conductor circuit formed on the surface of one of said insulating substrates is electrically connected via an interlayer conductor to the conductor circuit formed on a surface of one of the other insulating substrate.

8. The circuit substrate according to claim 7, wherein said conductor circuit has an inductance circuit or a capacitance circuit.

9. A method of manufacturing a circuit substrate, comprising the steps of:

preparing a green sheet composed of the glass-ceramic composition according to claim 1;

forming an Ag or Au system conductor layer at least on a surface of said green sheet;

laminating a plurality of green sheets each having the conductor layer formed thereon; and firing the laminated green sheets at a firing temperature in the range of 800 to 930° C. under an oxidizing atmosphere.

* * * * *